United States Patent
Schinella

(10) Patent No.: US 6,730,588 B1
(45) Date of Patent: May 4, 2004

(54) METHOD OF FORMING SIGE GATE ELECTRODE

(75) Inventor: Richard Schinella, Saratoga, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/026,407

(22) Filed: Dec. 20, 2001

(51) Int. Cl.⁷ ................. H01L 21/3205; H01L 21/4763
(52) U.S. Cl. ................. 438/592; 438/585; 438/598; 438/622; 438/652; 438/655; 438/682; 438/933
(58) Field of Search ................. 438/622, 652, 438/655, 657, 666, 669, 672, 682, 933, 585, 592, 598; 257/412, 413

(56) References Cited

U.S. PATENT DOCUMENTS

| | | | |
|---|---|---|---|
| 5,202,284 A | * 4/1993 | Kamins et al. | 117/95 |
| 5,242,847 A | * 9/1993 | Ozturk et al. | 438/300 |
| 5,336,903 A | 8/1994 | Ozturk et al. | |
| 5,998,289 A | * 12/1999 | Sagnes | 438/592 |
| 6,156,658 A | * 12/2000 | Wang et al. | 438/688 |
| 6,214,679 B1 | * 4/2001 | Murthy et al. | 438/299 |
| 6,235,568 B1 | * 5/2001 | Murthy et al. | 438/231 |
| 6,437,376 B1 | * 8/2002 | Ozkan | 257/197 |

OTHER PUBLICATIONS

"Polycrystalline Silicon–Germanium Films on Oxide Using Plasma–Enhanced Very–Low–Pressure Chemical Vapor Deposition"; Mass. Institute of Technology; Apr. 10, 1995; 8pp.; (Pub C95101); Research 309–Author(s) J.A. Tsai and R. Reif.

* cited by examiner

Primary Examiner—Maria Guerrero
(74) Attorney, Agent, or Firm—Beyer Weaver & Thomas, LLP

(57) ABSTRACT

The present invention provides a method of forming SiGe gate electrodes using a thin nucleation layer. A dielectric layer is formed on a semiconductor wafer and a thin silicon nucleation layer deposited on top of the dielectric layer. A SiGe conducting film is deposited on the patterned silicon layer. The ratio of germanium to silicon in the gaseous source mixture for the silicon and germanium layer is selected so that the SiGe conducting film deposits on the nucleation layer but fails to deposit on the dielectric.

18 Claims, 2 Drawing Sheets

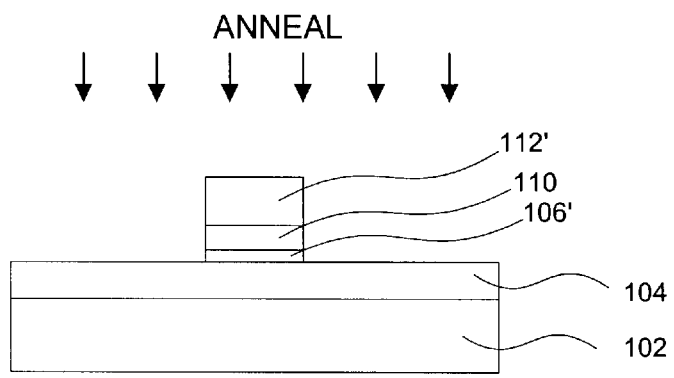
FIG. 1H
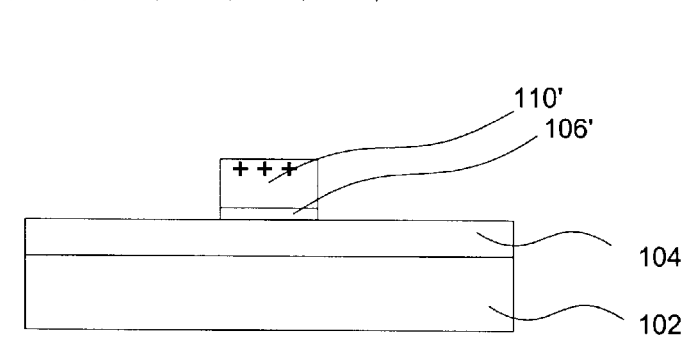
FIG. 1F'
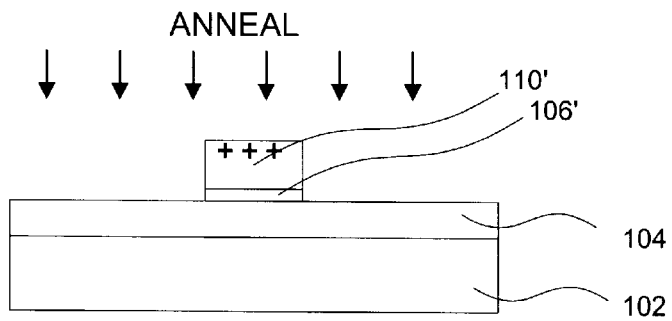
FIG. 1F"

METHOD OF FORMING SIGE GATE ELECTRODE

BACKGROUND OF THE INVENTION

1. Field of the Invention

The present invention relates to methods of forming gate electrodes in semiconductor devices. More particularly, the present invention relates to forming SiGe gate electrodes using a thin nucleation layer.

2. Description of the Related Art

As features on semiconductor devices, such as integrated circuit chips, continue to decrease in size thinner gate dielectric films are required. For example, a 90 nm gate node may require a gate dielectric thickness of about 15 Angstroms. Even with these thin gate dielectric films, the overlying polysilicon gate electrode layer will likely continue to be relatively thicker. The gate electrode layers need a certain minimum thickness to have adequate conductivity. Thick electrode layers used in conjunction with thin dielectrics present several problems.

Typically a photoresist layer is applied on top of the electrode layer and patterned using photolithographic processes. The patterned photoresist conventionally has a thickness proportional to the thickness of the gate electrode material being etched. A relatively thick photoresist layer has been conventionally used with plasma etching to prevent areas of the wafer covered by the photoresist from exposure by the etching chemicals as they etch the uncovered portion of the gate electrode layer. A certain thickness of photoresist has been required with conventional processes in the past to last through the plasma etch step used to pattern the electrode material.

The high aspect ratios resulting from the patterning of thick gate electrode materials to very small dimensions presents major challenges for the photolithography process.

Thick photoresist layers limit the optical resolution obtainable on the wafer. Subsequent etching of the thick electrode material without breaking through the thin gate dielectric will be very difficult since variations in thickness and etch rate of the thick electrode material across the wafer result in the gate dielectric material being exposed sooner in some regions than in other regions. This, in turn, can result in the etch penetrating through the thin dielectric material rather than stopping short of break through. Penetration can result in unacceptable attack of the underlying source/drain silicon regions, resulting in device reliability and yield problems. Moreover, variation in the etching characteristics of the electrode material and variations in the thickness of the electrode material will result in across the wafer and wafer to wafer variability which may translate into variations of the gate edge slope. In addition, lateral etching problems presented by the thick electrode material may result in problems in critical dimension control.

Accordingly, it is desirable to produce a gate electrode using thin photoresist layers and very short and controllable etch sequences.

SUMMARY OF THE INVENTION

To achieve the foregoing, the present invention provides an unconventional method of forming gate electrodes in semiconductor devices. In one aspect, the invention provides a SiGe gate electrode formed using a thin silicon nucleation layer. A dielectric layer is formed on a semiconductor wafer and the thin silicon nucleation layer deposited on top of the dielectric layer and patterned to form the base of a gate electrode. A SiGe (silicon germanium) conducting film is deposited on the gate electrode nucleation layer. The ratio of germanium to silicon in the gaseous source mixture for the silicon and germanium conducting film is selected so that the SiGe conducting film deposits on the nucleation layer but fails to deposit on the dielectric. The method enables the selective deposition of a gate electrode with the use of very thin photoresist layers to pattern a thin base layer. The deposited silicon nucleation layer is also thin and thus requires only short, controllable etch sequences.

In one aspect, the invention provides a method of forming a gate electrode on a semiconductor device. A dielectric layer is formed on the semiconductor wafer. A thin silicon layer is deposited on the dielectric layer. In one aspect the silicon layer is void free and has a thickness in the range from about 50 Angstroms to 2000 Angstroms. The silicon layer is patterned and etched to form a gate electrode nucleation layer. A silicon germanium conducting film is deposited on the nucleation layer. The silicon germanium source gas mixture is selected so that the film deposits on the gate electrode nucleation layer but fails to deposit on the dielectric layer. In another aspect, the deposited silicon layer is a monolayer.

In another aspect a metal layer is deposited on the deposited silicon germanium conducting film. The metal layer is annealed to form a low resistance germanide silicide contact.

In yet another aspect, a gaseous mixture comprising the germane and silane further comprises dopants for doping the silicon layer. The ratio of germane to at least one of silane and dichlorosilane ($SiH_2Cl_2$) is in the range from about 0.025 to 1.00.

These and other features and advantages of the present invention are described below with reference to the drawings.

BRIEF DESCRIPTION OF THE DRAWINGS

FIGS. 1A–1H depict stages in the formation of a SiGe gate in accordance with one embodiment of the present invention.

FIGS. 1F' and 1F" depict stages of in-situ doping in the formation of a SiGe gate in accordance with another embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIGS. 1A–1H depict stages in the formation of a SiGe gate in accordance with one embodiment of the present invention. Initially, a dielectric layer 104 is deposited on a substrate 102. In one embodiment, dielectric 104 comprises $SiO_2$. The description of $SiO_2$ as the dielectric is intended to be illustrative and not limiting. Other dielectric layers are expected to prevent deposition of silicon germanium conducting films when the percentage of germane in the gas mixture exceeds a threshold and the present invention is intended to cover all such embodiments.

Figure 1A:
Figure 1B:

Next, as illustrated in FIG. 1B, a very thin layer of amorphous or polycrystalline silicon 106 is deposited over a partially processed semiconductor wafer prior to the gate electrode formation step. The silicon layer 106 may be doped or undoped. The process parameters necessary for the deposition of silicon on a substrate are well known to those of skill in the art. For example, silane ($SiH_4$) is a common source of silicon in chemical vapor deposition (CVD) processes. Ideally, the silicon nucleation layer will be uniform, void-free, thin, and quickly deposited. The silicon nucleation layer may have a suitable thickness in the range from 50 to 2000 Angstroms, with a preferable range in one embodiment from 100 to 500 Angstroms. The nucleation layer may be desirably set to a thickness that renders it continuous. The process conditions will determine these characteristics. For example, high pressure and low temperature during the chemical vapor deposition of the silicon will help form a uniform thin layer quickly. Deposited silicon tends to aggregate in "islands" when it nucleates on a surface. However, dropping the surface temperature decreases the mobility and allows coverage to occur quickly. Typically a deposition of the silicon takes place at a temperature of several hundred degrees.

A thin silicon nucleation layer is further desirable because it can be delineated using a thin photoresist layer. Decreasing the photoresist layer thickness results in shorter exposure times and better fidelity. Furthermore, thicker photoresist layers require higher doses of exposure and result in an increasing range of scattering of the incident photolithographic exposure light.

In several embodiments, the thickness of the photoresist layer will approximate the thickness of the silicon nucleation layer. The photoresist layer thickness needs to be thick enough to provide an etch barrier for the underlying thin silicon nucleation layer and the present invention is intended to cover all such embodiments where the photoresist layer meets the etch barrier requirements, including where the photoresist is substantially thinner than the thickness of the nucleation layer.

The silicon may be deposited by various techniques well known to those with skill in the art including evaporative techniques, chemical vapor deposition (CVD) or plasma vapor deposition (PVD), or sputtering. Sputtering and evaporative techniques may result in depositing a layer of silicon at a much lower temperature, for example room temperature, than deposited by other techniques described. Atomic layer deposition (ALD) techniques may be used to deposit a thin silicon nucleation layer such as a monolayer (i.e., as thin as 2–4 Angstroms). ALD techniques are particularly suitable for depositing thin, highly conformal films. The process occurs at much lower temperatures than CVD techniques.

Figure 1C:
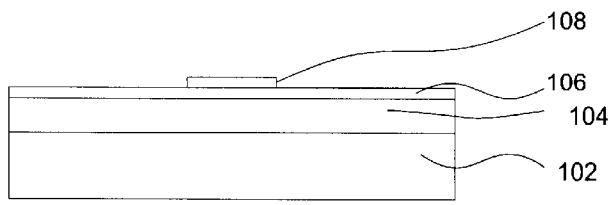

A photoresist layer is then deposited and patterned according to conventional techniques. The pattern photoresist layer 108 is illustrated in FIG. 1C. The photoresist layer will ideally have a thickness approximating that of the silicon nucleation layer 106. For example, a silicon nucleation layer 106 thickness of 150 Angstroms is expected to be suitably etched using a photoresist layer 108 also about 150 Angstroms in thickness. The present technique allows very thin layers of photoresist to be used for patterning and allows higher resolution to be obtained as shorter exposure wavelengths are utilized. Suitable results may be expected using a photoresist layer ranging in thickness from about 100 Angstroms to about 2000 Angstroms. The thinner photoresist layers are also advantageous in requiring less photoresist materials for patterning, thereby providing economies in chemical costs and requiring shorter exposure times on expensive lithography scanning equipment. The shorter exposure times results in higher throughput rates on the scanning equipment. Conventional photolithographic techniques are used to pattern the thin silicon layer into electrode regions such as gate electrodes of CMOS transistors, electrodes of capacitors, and electrodes of EEPROM and Flash devices.

Figure 1D:
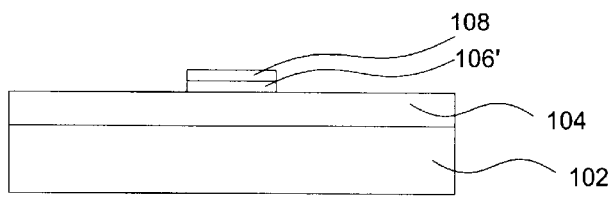

The thin Si nucleation layer 106 is etched in a manner leaving the dielectric 104 exposed wherever electrodes are not desired. Etch chemicals are selected to have a selectivity to oxides high enough so as not to punch through the portions of the thin gate dielectric 104 that are left exposed. FIG. 1D illustrates the patterned photoresist 108 stacked on top of the etched thin silicon nucleation layer 106'. The photoresist layer 108 is then removed using conventional techniques.

Figure 1E:
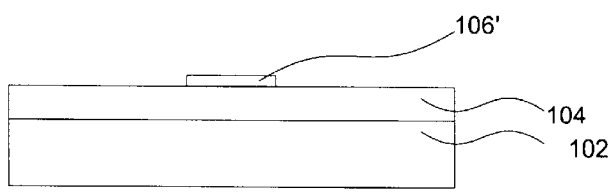

FIG. 1E illustrates the partially formed device after removal of the photoresist layer. The patterned and etched silicon nucleation layer 106" is shown and provides a target for the silicon-germanium conducting film to be deposited in the next step.

Figure 1F:
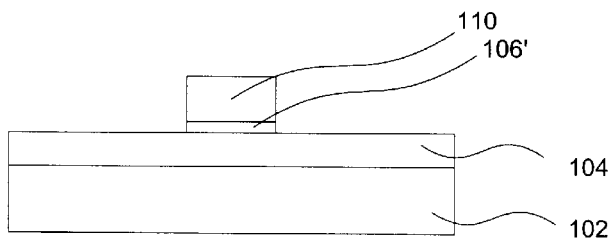

As illustrated in FIG. 1F, a silicon germanium (SiGe) conducting film is deposited on the patterned and etched nucleation layer 106'. Techniques for depositing silicon-germanium alloys are known in the art, for example as described in U.S. Pat. No. 5,336,903 entitled "Selective Deposition of Doped Silicon-Germanium Alloy on Semiconductor Substrate, and Resulting Structures", which is incorporated by reference in its entirety. The SiGe conductive film may be amorphous or polycrystalline. Deposition occurs by creating a gaseous environment comprising silane ($SiH_4$) and germane ($GeH_4$) in a ratio that precludes deposition on the exposed dielectric material. Other gaseous sources of silicon may be provided including dichlorosilane ($SiH_2Cl_2$). The dielectric is typically $SiO_2$, but in other embodiments, may be any other material that precludes nucleation of SiGe film when suitable ratios of germane and silane (or other sources of silicon) are used. The SiGe conductive film may be deposited using low pressure chemical vapor deposition (LPCVD) techniques familiar to those of skill in the art. It is expected that the selected deposition of the silicon germanium conductive film may be achieved at a temperature range of about 300 to 800 degrees C. In one embodiment, the ratio of germane to silane or dichlorosilane ($SiH_2Cl_2$) is selected such that no deposition of the SiGe conductive film occurs on the dielectric layers. It is expected that ratios of germane to dichlorosilane in the amounts of about 0.025 to about 1.00 will produce suitable results. A pressure of about 2.5 Torr is suitable. In a preferred embodiment, a temperature of about 600 degrees C. is used for the LPCVD process and a ratio of germane to dichlorosilane ($SiH_2Cl_2$) of 0.20 is used. The process may also be adapted to use silane by one of skill in the art with minimal experimentation. Similar process parameter ranges are expected to produce suitable results when silane is used as the gaseous source for silicon. The precise ratio of silane to germane for selective deposition of SiGe conductive films may be empirically determined and would be a function of the partial pressures of $GeH_4/SiH_4$, temperature, and total pressure.

Figure 1G:
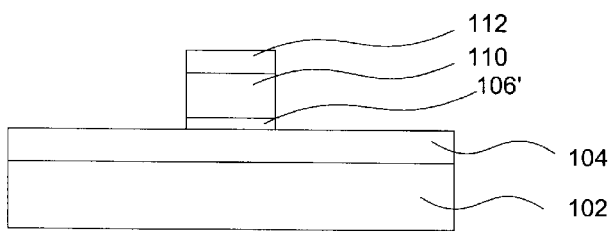

Metallic gaseous compounds may be included in the gaseous source mixture to produce silicide-germanide mixtures or compounds to enhance the electrode characteristics. As illustrated in FIG. 1G, metallic layer 112 is deposited through this technique. Suitable metals for the production of metal layer 112 include titanium (i.e., $TiCl_4$) and cobalt.

In accordance with conventional techniques for performing silicides, the metal layer is converted to a silicide-germanide compound or a simple germanide compound through an annealing process. The resulting gate structure comprises a silicide germanide shunt layer 112' overlaying the silicon germanium electrode 110. Ideally, the siliciding of the metal layer will consume most or all of the silicon germanium electrode to result a structure having a shunt layer 112" thicker than the silicon germanium layer 110, as shown in FIG. 1H.

In alternate embodiments, appropriate dopants such as $B_2H_6$, $PH_3$, $AsH_3$, $BCl_3$, and $PCl_3$, etc may be included in the gas mixture to provide in-situ doping. The dopants may be included at a constant concentration during the deposition stage or may be changed during the deposition stage to provide a gradient doping to more suitably meet the device needs. As illustrated in FIG. 1F', a doped silicon germanium layer 110' is formed by introducing the dopants during the deposition of the silicon germanium conductive film. A subsequent anneal process as illustrated in FIG. 1F", increases the uniformity by redistributing the dopant.

The very thin photoresist layers used are easy to pattern and produce and create higher resolutions than available through conventional electrode formation techniques. The thin photoresist layers further provide increased throughput as a result of the decreased etching time. The thin photoresist layers also reduce or eliminate sidewall slopes or other undesirable undercutting of the pattern. Fidelity of the thin silicon nucleation layer 106 to the photoresist is very high. Furthermore, the silicon germanium conducting film deposited on top of the silicon nucleation layer is self-aligned and also has good fidelity to the patterned and etched silicon layer.

Although the foregoing invention has been described in some detail for purposes of clarity of understanding, it will be apparent that certain changes and modifications may be practiced within the scope of the appended claims. For example, the process of the present invention is applicable to any scheme where materials for a thin nucleation film and a gate dielectric are selected and used in selective deposition of a gate electrode material in a semiconductor fabrication process. Accordingly, the present embodiments are to be considered as illustrative and not restrictive, and the invention is not to be limited to the details given herein, but may be modified within the scope and equivalents of the appended claims.

What is claimed is:

1. A method of forming a gate electrode on a semiconductor device, the method comprising:
   forming a dielectric layer on a semiconductor wafer;
   depositing a thin silicon layer having a thickness in the range of 100 to 500 Angstroms on the dielectric layer;
   patterning and etching the thin silicon layer to form a silicon nucleation layer and to expose portions of the dielectric layer;
   forming a self-aligned gate electrode by depositing a silicon germanium conducting film on the silicon nucleation layer using a material which selectively deposits on the nucleation layer and which fails to deposit on the exposed portions of the dielectric layer; and
   depositing a metal layer on the deposited silicon germanium conducting film.

2. The method recited in claim 1 wherein the metal layer is one of titanium and cobalt.

3. The method recited in claim 1 further comprising annealing the metal layer to form a germanide silicide contact.

4. The method recited in claim 1 wherein the silicon layer comprises at least one of amorphous silicon and polycrystalline silicon.

5. The method recited in claim 1 wherein the dielectric layer comprises silicon dioxide ($SiO_2$).

6. The method recited in claim 1 wherein the silicon germanium conducting film is deposited at a temperature in the range from about 300 to 800 degrees C.

7. The method recited in claim 1 wherein the metal layer is formed in situ during the formation of the silicon germanium film.

8. The method recited in claim 1 wherein the silicon germanium conducting film is deposited using a gaseous mixture comprising germane and at least one of silane ($SiH_4$) and dichlorosilane ($SiH_2Cl_2$).

9. The method recited in claim 1 wherein the patterning and etching of the silicon layer comprises depositing a photoresist layer on the silicon layer.

10. The method recited in claim 8 wherein the proportions of germane and at least one of silane and dichlorosilane ($SiH_2Cl_2$) are selected to preclude deposition of SiGe on the dielectric layer.

11. The method recited in claim 8 wherein the selective depositing of the silicon germanium conducting film is performed by adjusting the ratio of germane to dichlorosilane ($SiH_2Cl_2$) in the gaseous mixture to about 1:5.

12. The method recited in claim 8 wherein the ratio of germane to dichlorosilane ($SiH_2Cl_2$) is in the range from about 0.025 to 1.00.

13. The method recited in claim 9 wherein the photoresist layer ranges from about 100 Angstroms to 2000 Angstroms in thickness.

14. The method recited in claim 8 wherein the gaseous mixture further comprises dopants for doping the silicon germanium conducting film.

15. The method recited in claim 14 wherein the dopants are maintained at a constant concentration during the deposition of the silicon germanium conducting film.

16. The method recited in claim 14 wherein the dopant concentration is changed during the deposition of the silicon germanium conducting film to provide a doping gradient in the silicon germanium conducting film.

17. A method of forming a gate electrode on a semiconductor device, the method comprising:
   forming a dielectric layer on a semiconductor wafer;
   depositing a silicon layer having a thickness in the range of 100 to 500 Angstroms on the dielectric layer;
   patterning and etching the silicon layer to form a gate electrode nucleation layer; and
   forming a gate electrode by depositing a silicon germanium conducting film on the gate electrode nucleation layer using a material which selectively deposits on the nucleation layer and which fails to deposit on the dielectric layer.

18. A method of forming a gate electrode on a semiconductor device, the method comprising:

forming a dielectric layer on a semiconductor wafer;
depositing a silicon layer on the dielectric layer;
patterning and etching the silicon layer to form a gate electrode nucleation layer; and
forming a gate electrode by depositing a silicon germanium conducting film on the gate electrode nucleation layer using a gaseous mixture comprising germane and at least one of silane ($SiH_4$) and dichlorosilane ($SiH_2Cl_2$) which selectively deposits on the nucleation layer and which fails to deposit on the dielectric layer, wherein the gaseous mixture further comprises dopants for doping the silicon layer and the dopant concentration is changed during the deposition of the silicon germanium conducting film to provide a doping gradient in the silicon germanium conducting film.

* * * * *